(12) United States Patent
Germann et al.

(10) Patent No.: US 8,491,739 B2
(45) Date of Patent: Jul. 23, 2013

(54) IMPLEMENTING INTERLEAVED-DIELECTRIC JOINING OF MULTI-LAYER LAMINATES

(75) Inventors: Philip R. Germann, Oronoco, MN (US); Mark J. Jeanson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 12/878,297

(22) Filed: Sep. 9, 2010

(65) Prior Publication Data

US 2012/0061023 A1   Mar. 15, 2012

(51) Int. Cl.
*B32B 37/00*   (2006.01)
(52) U.S. Cl.
USPC ........................ 156/73.1; 156/290; 156/308.4

(58) Field of Classification Search
USPC ............... 156/73.1, 228, 250, 252, 257, 290, 156/308.2, 308.4
See application file for complete search history.

(56) References Cited

U.S. PATENT DOCUMENTS 4,857,135 A * 8/1989 Copp ........................... 156/580
7,794,555 B2 * 9/2010 LaFond et al. ................. 156/64

* cited by examiner

*Primary Examiner* — James Sells
(74) *Attorney, Agent, or Firm* — Joan Pennington

(57) ABSTRACT

A method and apparatus are provided for implementing interleaved-dielectric joining of multi-layer laminates. First and second multi-layer laminates are provided, each having with a laminated portion and an unlaminated portion. The first and second multi-layer laminates are joined together at the unlaminated portions by interleaving a plurality of dielectric layers of the first and second multi-layer laminates. Respective conductors carried by adjacent dielectric layers are connected. The interleaved unlaminated portions are laminated together with heat and pressure, to create a larger laminate of the joined first and second multi-layer laminates.

9 Claims, 10 Drawing Sheets

US 8,491,739 B2

IMPLEMENTING INTERLEAVED-DIELECTRIC JOINING OF MULTI-LAYER LAMINATES

FIELD OF THE INVENTION

The present invention relates generally to the data processing field, and more particularly, relates to a method and apparatus for implementing interleaved-dielectric joining of multi-layer laminates.

DESCRIPTION OF THE RELATED ART

System designers are limited by current form factors generally due to manufacturing limitations of printed circuit board (PCB) panel sizes. While lamination presses could be modified to create larger boards, the assembly and reflow process lines are generally limited by the dimensions of the largest panel size at a particular manufacturing site. As a result, backplane sizes have stayed relatively constant over time.

Based on cooling and power restrictions, this limits the overall performance density within a rack structure. Once the maximum performance density is reached, then another backplane, drawer, and the like, can be added to the rack, or to adjacent racks, but results in the penalty of creating lossy interconnections through cables and connectors.

If a very large PCB panel could be created, then performance within a rack could be improved by eliminating a series of connector and cable connections between individual backplanes, drawers, and the like.

For example, one known rack contains two midplanes, each with node cards plugged in. In order to communicate within the rack, cables must be used to connect the top midplane to the bottom midplane. These cables add complexity to the system, and latency to the signal messaging between the midplanes.

In addition, delivering power to large backplanes in a rack usually requires running cables from the AC-DC and/or DC-DC power supply to connectors on the backplane. The cables and connectors add complexity to the rack assembly, and take up significant PCB real estate. For example, if the maximum panel size has already been used, then every square inch used for non-compute components will reduce the performance density in the rack. Power delivery within a rack can be improved by directly joining the power supply or power board to the midplane, thereby avoiding the lossy power cables and connectors.

To join boards or multiple PCBs together, typically connectors are used, introducing additional mechanical failure points, and electrical parasitics. In addition, multi-layer laminates, for example, one with N layers and one with M layers can be joined together into a single multi-layer laminate with M+N layers as a larger composite. These boards consist of two or more PCBs of the same size, which are already laminated, being laminated together into a thicker board. For example, a metal-to-metal z-axis interconnection process can be used can join multiple subcomposites together, as will be appreciated by those skilled in the art.

Sequential lamination is a method by which PCBs are formed, laminated, and plated individually. Then the separate, thinner composites are laminated together into a thicker, high-layer-count board. This process allows for the control of via stubs for electrical performance, and enhanced wireability for escapes from very large area array components. The sequential lamination process does not expand the panel size of the PCB; it is limited to the standard panel sizes already in place at a particular manufacturer's facility.

SUMMARY OF THE INVENTION

Principal aspects of the present invention are to provide a method and apparatus for implementing interleaved-dielectric joining of multi-layer laminates. Other important aspects of the present invention are to provide such method and apparatus for implementing interleaved-dielectric joining of multi-layer laminates substantially without negative effects and that overcome many of the disadvantages of prior art arrangements.

In brief, a method and apparatus are provided for implementing interleaved-dielectric joining of multi-layer laminates. First and second multi-layer laminates are provided, each having with a laminated portion and an unlaminated portion. The first and second multi-layer laminates are joined together at the unlaminated portions by interleaving a plurality of dielectric layers of the first and second multi-layer laminates. Respective conductors carried by adjacent dielectric layers are connected. The interleaved unlaminated portions are laminated together with heat and pressure, to create a larger laminate of the joined first and second multi-layer laminates.

In accordance with features of the invention, a pre-impregnated composite fibers material is applied between the dielectric layers. Then the unlaminated portions are laminated together with heat and pressure applied.

In accordance with features of the invention, ultrasonic welding (USW) optionally is used for connecting a plurality of shapes carried by adjacent dielectric layers, such as the conductors carried by adjacent dielectric layers.

In accordance with features of the invention, a plated through hole (PTH) process optionally is used for connecting a plurality of shapes carried by adjacent dielectric layers, such as the conductors carried by adjacent dielectric layers.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, first and second multi-layer laminates are provided, each having with a laminated and unlaminated portion. Each respective unlaminated portion is patterned with cooperating mating conductors and interconnection pads, and left unlaminated. The two multi-layer laminates joined together at the unlaminated portions by interleaving the dielectric layers, connecting the conductors. Heat and pressure are applied to laminate the multiple layers together.

Figure 1:
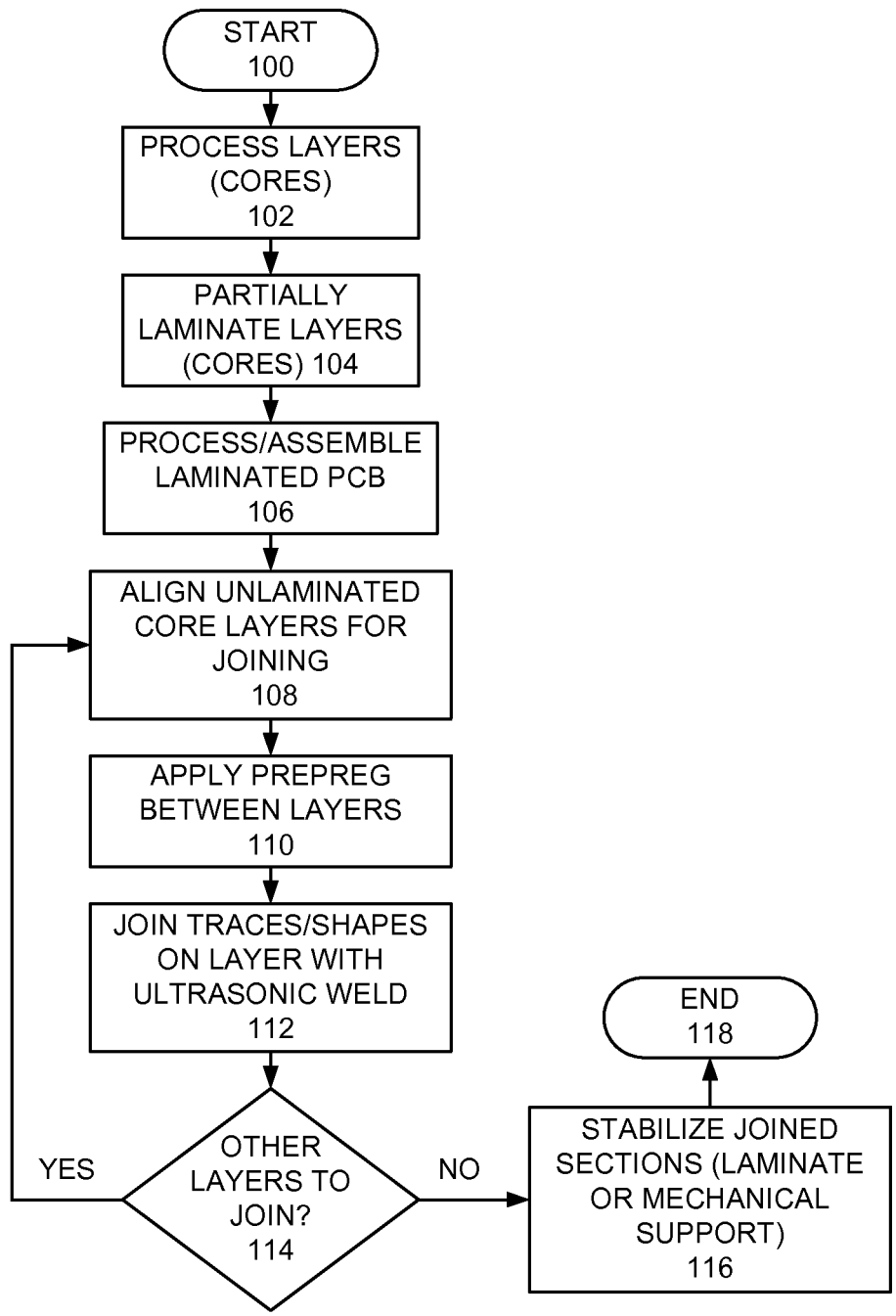
FIG. 1 is flow chart illustrating example steps for implementing interleaved-dielectric joining of multi-layer laminates in accordance with a preferred embodiment.

Having reference now to the drawings, in FIG. 1, there is shown a flow chart illustrating example steps of a method in accordance with a preferred embodiment starting at a block 100. Dielectric layers or cores are processed including generally conventional signal etching with circuit patterns as indicated at a block 102. The etched circuit patterns can be routed anywhere within the entire core area. The cores are partially laminated, while providing a selected unlaminated portion of the cores as indicated at a block 104. The laminated printed circuit board (PCB) portion is further processed and assembled as indicated at a block 106.

The unlaminated core layers are aligned for joining as indicated at a block 108. As indicated at a block 110, a pre-impregnated composite fibers material in the form of a weave or uni-directional composite fibers, containing an amount of the matrix material used to bond the composite fibres together and to other components or prepreg material, is applied between the core layers. The traces and predefined shapes on adjacent layers are joined together, for example, by ultrasonic weld (USW) as indicated at a block 112.

Checking for other layers to join is performed as indicated at a decision block 114. Then other identified layers are joined together returning to block 108. With all layers joined, then the joined sections are stabilized as needed, for example, with a laminate or mechanical support as indicated at a block 116. The operations are completed as indicated at a block 118.

Figure 2A:
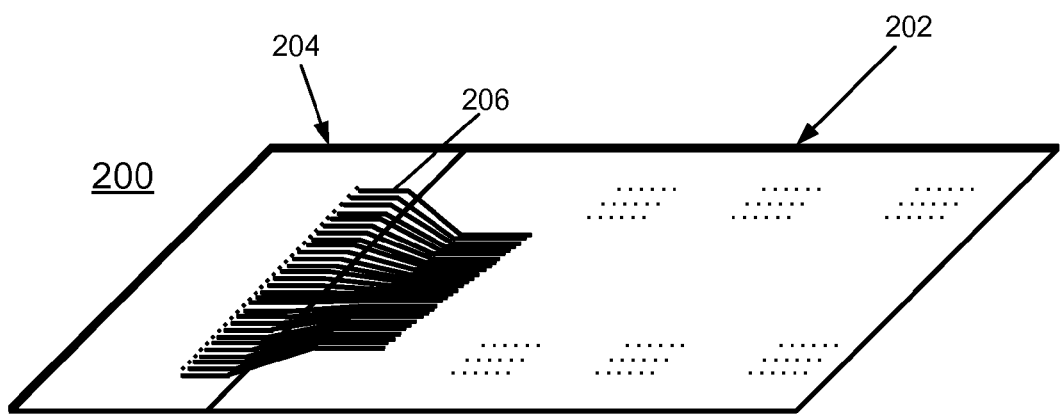
FIGS. 2A and 2B are example multi-layer laminates, each having with a laminated and unlaminated portion, to be joined together at the unlaminated portions by interleaving the dielectric layers, connecting the conductors, and then laminating the unlaminated portion together with heat and pressure, to create a larger laminate in accordance with a preferred embodiment.
Figure 2B:
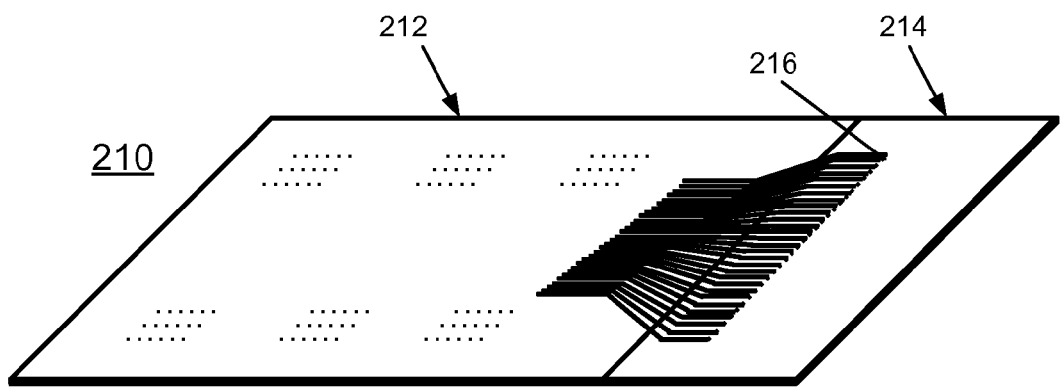

Referring now to FIGS. 2A, and 2B, there is shown not to scale a respective first and second example multi-layer laminates respectively generally designated by the reference characters 200, 210 in accordance with a preferred embodiment. Each of the multi-layer laminates 200, 210 has a respective laminated portion 202, 212 and a respective unlaminated portion 204, 214. The respective unlaminated portions 204, 214 are configured to be joined together, for example, by interleaving the dielectric layers, connecting predetermined mating conductors 206, 216, and then laminating the unlaminated portion together with heat and pressure, to create a larger foot print for the resulting overall laminate in accordance with a preferred embodiment.

The unlaminated portion 204 and the unlaminated portion 216 are joined by interleaved-dielectric joining of the first and second example multi-layer laminates 200, 210 in accordance with a preferred embodiment. The signal conductors 206, 216 are connected together, and a pre-impregnated composite fibers material is applied between the dielectric layers before the unlaminated portions 204, 214 are laminated together with heat and pressure applied.

Figure 3:
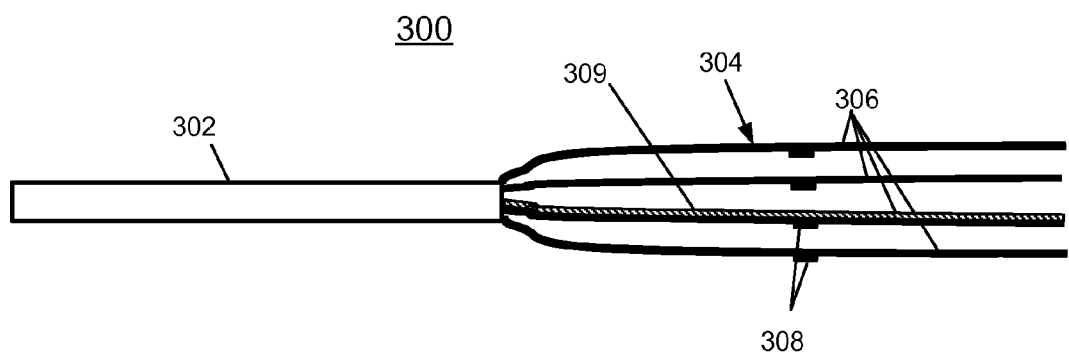
FIG. 3 is an example multi-layer laminate having with a laminated portion and an unlaminated portion for implementing interleaved-dielectric joining of multi-layer laminates in accordance with a preferred embodiment.

Referring now to FIG. 3, there is shown not to scale an example multi-layer laminate generally designated by the reference characters 300 having with a laminated portion 302 and an unlaminated portion 304 for implementing interleaved-dielectric joining of multi-layer laminates in accordance with a preferred embodiment.

As shown in FIG. 3, the unlaminated portion 304 of the example multi-layer laminate 300 includes a plurality of dielectric layers or unlaminated cores 306. Each of the dielectric layers 306 includes an interconnection pad or pad 308 for electrically connecting signal traces and predefined shapes on an adjacent layer to be joined together of another multi-layer laminate (not shown). As shown one of the dielectric layers 306 includes, for example, a solid electrically conductive plane 309 providing a continuous electrical reference for signal. Registration features can be used to insure alignment during subsequent steps. Typical antipad, capture pad, and other manufacturing features are also included, per conventional or normal printed circuit board (PCB) design.

Figure 4A:
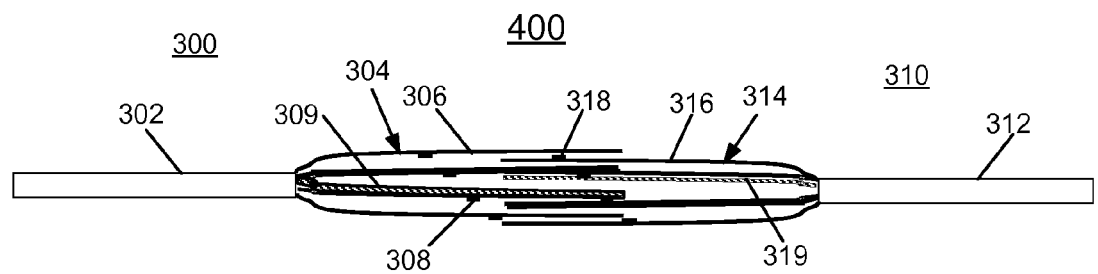
FIGS. 4A, 4B, and 4C illustrate example steps for implementing interleaved-dielectric joining of multi-layer laminates in accordance with a preferred embodiment.

The laminated portion 302 includes, for example, 8 laminated layers or laminated cores. Note, that in order for the board thickness in the joined portion of the boards to be the same as the originally laminated portions, only ½ of the core layers from the original board are used, with the unlaminated portion 304 of the example multi-layer laminate 300 including 4 unlaminated layers or unlaminated cores. The laminated portion 302 of the example multi-layer laminate or board 300 can undergo component assembly processes, in order to use the standard-size reflow equipment available at most manufacturing sites. The component assembly process of the laminated portion 302 will not harm the unlaminated portion 304 of the board. A second multi-layer laminate or board, such as a multi-layer laminate or PCB 310 shown in FIG. 4A, is formed in the same way, with corresponding pads and signal traces to mate with the first. The two boards are then stacked together one layer at a time with the connections joined together.

Figure 4B:
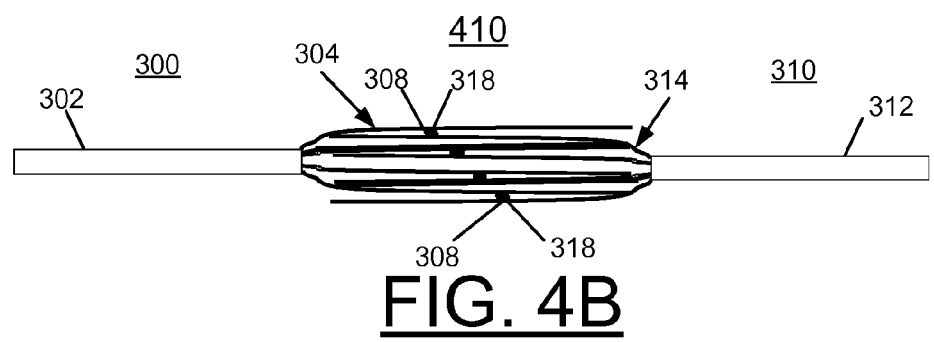
Figure 4C:
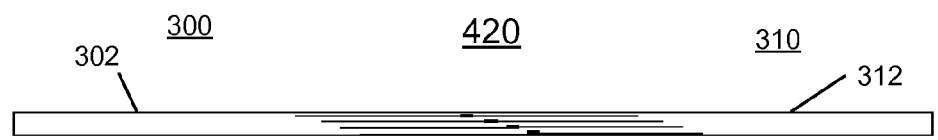

Referring now to FIGS. 4A, 4B, and 4C, there are shown example steps not to scale for implementing interleaved-dielectric joining of multi-layer laminates in accordance with a preferred embodiment.

In FIG. 4A, a first step generally designated by the reference character 400 is shown after the first and second multi-layer laminates 300, 310 are formed with the respective laminated portion 302, 312 and the unlaminated portion 304, 314. The unlaminated portions 304, 314 of the first and second multi-layer laminates 300, 310 are stacked together one layer 306, 316 at a time.

In FIG. 4B, a next step generally designated by the reference character 410 is shown with the connections 308, 318 joined together. As the layers 306, 316 are joined, then a prepreg material is added over the joined layer, and the next layer up is mated and joined. In this way, the previously unlaminated portions 304, 314 of the PCBs 300, 310 become interleaved, and can be laminated together. Any embedded components, such as resistors or capacitors, that are desired in the unlaminated area 304, 314 are added at this stage.

In FIG. 4C, a final assembly step generally designated by the reference character 420 is shown with appropriate heat and pressure having been applied to laminate the layers together in the area of the previously unlaminated portions 304, 314 of the PCBs 300, 310. After the assembly step 420, the signals have a continuous path through the joined section, for example, the reference planes 309, 319 on the backside of the cores 306, 316 are joined to create a continuous electrical reference for the signals.

It should be understood that depending on the requirements for the connections and traces, the final lamination step 420 may not be required. For example, if the joint is intended to be used only for power delivery, then there is no requirement that this final lamination step must take place. Epoxy or other mechanical means could be used to hold the joined area stable. If the joined traces require impedance control, then the final lamination step 420 is needed to maintain a reasonable tolerance on the dielectric thickness and to make the dielectric material property more uniform relative to the traces in the originally laminated sections of the boards 300, 310.

It should be understood that the present invention can be used generally with any PCB process currently in use during typical lamination processes, such as impedance control, embedded components, optical channels, and the like.

Referring now to FIGS. 5A, 5B, 5C, and 5D, there are shown example steps not to scale for implementing interleaved-dielectric joining of multi-layer laminates using ultrasonic welding (USW) in accordance with a preferred embodiment.

Figure 5A:
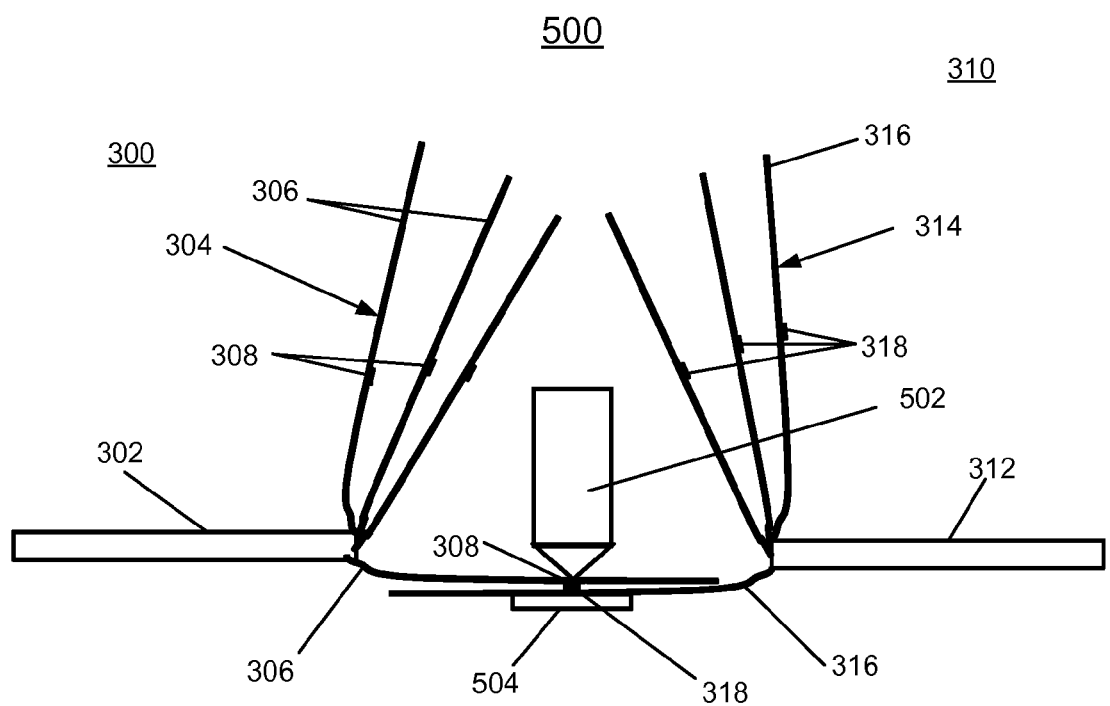
FIGS. 5A, 5B, 5C, and 5D illustrate example steps for implementing interleaved-dielectric joining of multi-layer laminates in accordance with a preferred embodiment.

In FIG. 5A, a first step generally designated by the reference character 500 is shown after the first and second multi-layer laminates 300, 310 are formed with the respective laminated portion 302, 312 and the respective unlaminated portion 304, 314. In step 500, an ultrasonic welder 502 is placed above respective lower adjacent layers 306, 316 with an anvil 504 located below the respective lower adjacent layers, each layer is bonded individually.

Figure 5B:
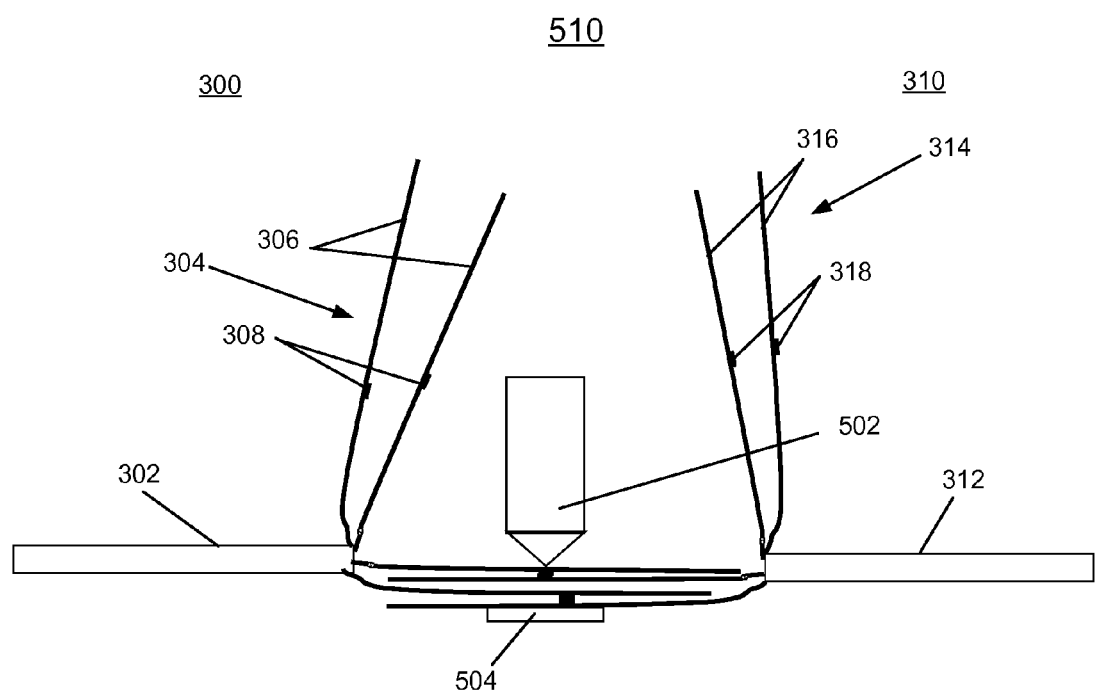
Figure 5C:
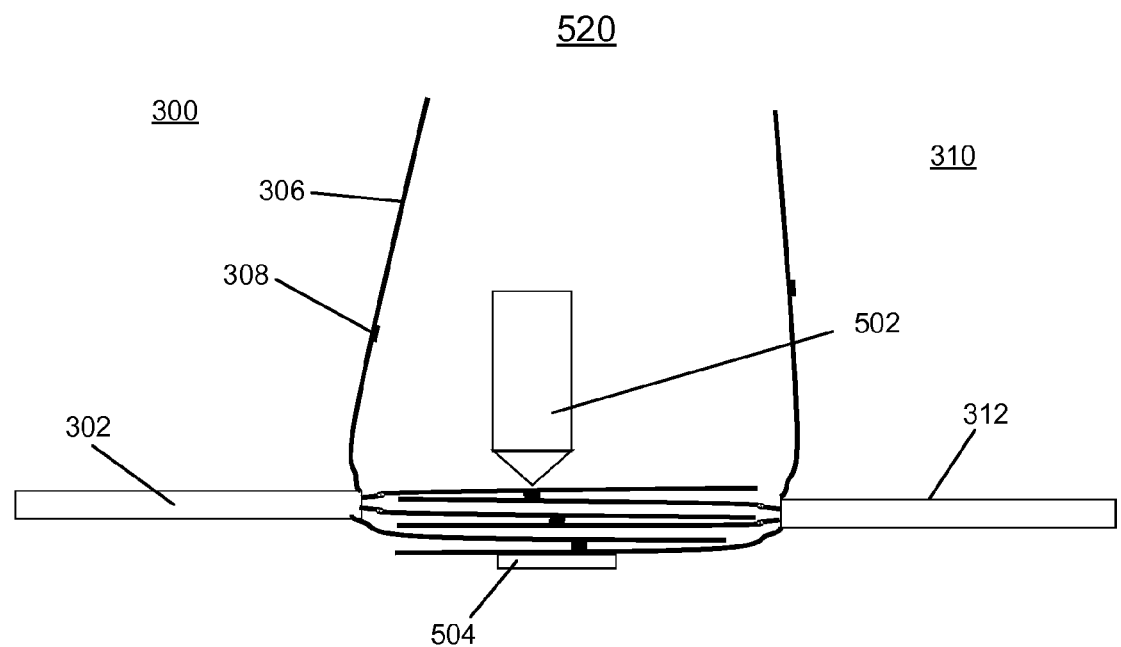
Figure 5D:
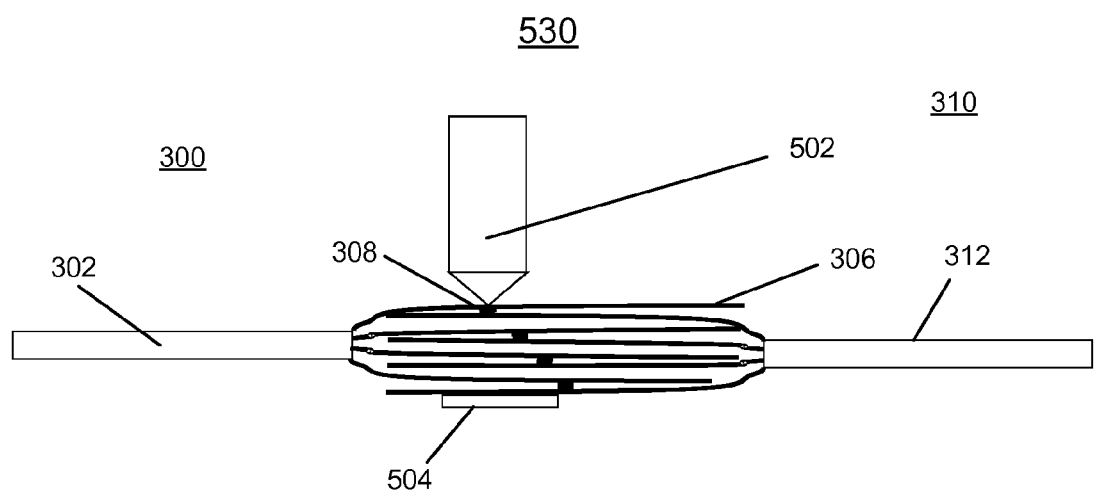

Referring also to FIGS. 5B, 5C, 5D sequential steps generally designated by the reference character 510, 520, and 530 illustrate the other layers 306, 316 are sequentially folded on top of the bonded layers. As each layer is bonded starting at step 500, a customized prepreg and resin material is added between the layers or cores 306, 316. The prepreg layer thickness can be controlled according to conventional or normal lamination techniques, including selection of cloth type, resin selection, lamination pressure, and the like, insuring that the thickness of the newly-joined area is similar to the thickness of the previously laminated area.

It should be understood that the cores do not need to be bent at sharp angles as shown in FIGS. 5A, 5B, 5C, and 5D to allow the USW welder 502 access to the pads 308, 318. The layers or cores 306, 316 are quite flexible, and the bends can be rounded to avoid stress on the copper etching. If necessary, to improve the reliability of the copper traces while bending each layer, the transition between laminated 302, 312 and unlaminated sections 304, 314 of the unjoined boards 300, 310 can be carefully designed with a selected angle to make the bend radius equal across all the layers or cores 306, 316.

It should be understood that ultrasonic welding is one process by which this invention is workable. There are other mechanical, chemical, or electrical joining methods, which may also be appropriate for joining the traces and/or planes on the cores. These processes typically occur as shown in FIG. 1, but could have other tooling or access requirements.

Figure 6:
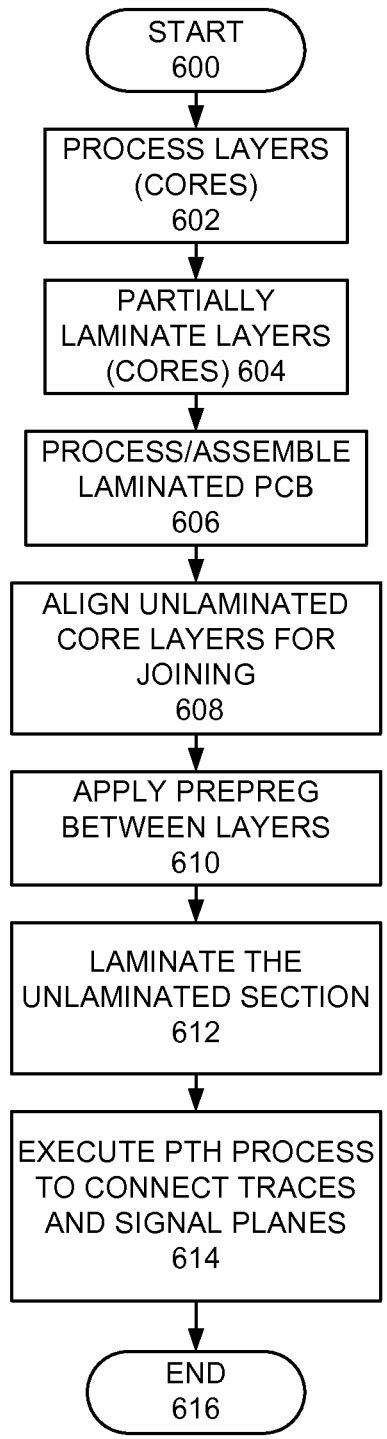
FIG. 6 is flow chart illustrating example steps of another method for implementing interleaved-dielectric joining of multi-layer laminates in accordance with a preferred embodiment.

For example, as shown in FIG. 6 instead of using the ultrasonic welding technique to join the boards together, plated through holes (PTHs) can be created through the joined section to connect the signals and power domains together with careful registration of the unlaminated portions 304, 314 of the PCBs 300, 310. Once the layers are registered, the lamination process can be completed, resulting in pads on different layers, connected to signals running to each respective sub-assembly. After lamination, the newly joined section can be drilled and plated using a standard PTH process, creating a PTH connection between the layers. While this process results in a via being formed at the joint, which is slightly less electrically ideal than a continuous trace, it is advantageously used rather than using the conventional arrangement of two connectors each with a via and a cable with two signal mode conversions required one on either end.

Referring to FIG. 6, there is shown a flow chart illustrating example steps of another method in accordance with a preferred embodiment starting at a block 600. Dielectric layers or cores are processed including generally conventional signal etching with circuit patterns as indicated at a block 602. The etched circuit patterns can be routed anywhere within the entire core area. The cores are partially laminated, while providing a selected unlaminated portion of the cores as indicated at a block 604. The laminated printed circuit board (PCB) portion is further processed and assembled as indicated at a block 606.

The unlaminated core layers are aligned for joining as indicated at a block 608. As indicated at a block 610, a pre-impregnated composite fibers material is applied between the core layers. After the pre-impregnated composite fibers material is applied, the aligned sections are laminated as indicated at a block 612.

A plated through hole (PTH) process is provided to connect the traces and predefined shapes on adjacent layers together as indicated at a block 614. The operations are completed as indicated at a block 616.

Figure 7:
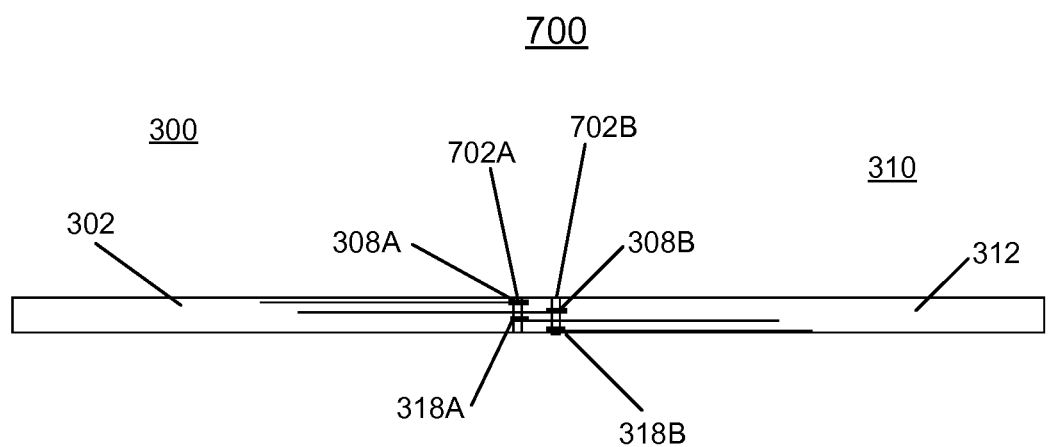
FIG. 7 is an example multi-layer laminate illustrating a final assembly step of a plated through hole (PTH) process of the method of FIG. 6 for implementing interleaved-dielectric joining of multi-layer laminates in accordance with a preferred embodiment.

Referring now to FIG. 7, a final assembly step generally designated by the reference character 700 is shown with appropriate heat and pressure having been applied to laminate the layers together in the area of the previously unlaminated portions 304, 314 of the PCBs 300, 310. The connection pads 308, 318 are then electrically connected together by executing a plated through hole (PTH) via process. In this way the pad 308A is electrically coupled to pad 318A through PTH 702A, and the pad 308B is electrically coupled to pad 318B through PTH 702B. It will be appreciated by those skilled in the art that blind or buried via processing techniques could also to connect pads 308 to each other vertically in the stackup.

It should be understood that in addition to enabling large panel expansion, this invention also enables the construction of complex laminated structures, which are not bound by panel area. For example, in high performance computing hardware applications, power and performance density are the key metrics. By building customized 3-dimensional structures based on this invention, a higher performance density, with potential cooling or power advantages, could be achieved.

While the present invention has been described with reference to the details of the embodiments of the invention shown in the drawing, these details are not intended to limit the scope of the invention as claimed in the appended claims.

What is claimed is:

1. A method for implementing interleaved-dielectric joining of multi-layer laminates comprising:
providing a first multi-layer laminate and a second multi-layer laminate, each of the first multi-layer laminate and the second multi-layer laminate having with a laminated portion and an unlaminated portion; each unlaminated portion including a plurality of dielectric layers;
aligning unlaminated portions of the first and second multi-layer laminates for joining;
applying a pre-impregnated composite fibers material between said aligned unlaminated portions of the first and second multi-layer laminates;
joining the first and second multi-layer laminates together at the unlaminated portions by interleaving the plurality of dielectric layers;
connecting a plurality of conductors carried by adjacent dielectric layers, and
laminating the interleaved portions together with heat and pressure, to create a larger laminate.

2. The method as recited in claim 1 includes providing a solid signal plane carried by one of the plurality of dielectric layers.

3. The method as recited in claim 1 includes connecting said plurality of conductors carried by adjacent dielectric layers using ultrasonic welding (USW).

4. The method as recited in claim 1 includes connecting said plurality of conductors carried by adjacent dielectric layers using plated through holes.

5. The method as recited in claim 1 includes laminating the interleaved portions together with heat and pressure, and connecting said plurality of conductors carried by adjacent dielectric layers using a plated through hole (PTH) process, creating a PTH connection between the conductors carried by adjacent dielectric layers.

6. The method as recited in claim 1 includes applying said pre-impregnated composite fibers material in a form of a weave of composite fibers.

7. The method as recited in claim 1 wherein said laminated portions and said laminated together interleaved portions have approximately equal thickness.

8. The method as recited in claim 1 wherein said laminated portions and said laminated together interleaved portions have an equal number of dielectric layers.

9. The method as recited in claim 1 includes providing each of said plurality of dielectric layers of said unlaminated portion with an interconnection pad for joining said plurality of conductors carried by adjacent dielectric layers being connected.

* * * * *